United States Patent
Suzuki et al.

(10) Patent No.: US 9,356,812 B2
(45) Date of Patent: May 31, 2016

(54) WIRELESS COMMUNICATION APPARATUS

(71) Applicant: DENSO CORPORATION, Kariya, Aichi-pref. (JP)

(72) Inventors: Tadao Suzuki, Kariya (JP); Yuji Sugimoto, Kariya (JP)

(73) Assignee: DENSO CORPORATION, Kariya, Aichi-pref. (JP)

(*) Notice: Subject to any disclaimer, the term of this patent is extended or adjusted under 35 U.S.C. 154(b) by 0 days.

(21) Appl. No.: 14/425,285

(22) PCT Filed: Aug. 23, 2013

(86) PCT No.: PCT/JP2013/004992
§ 371 (c)(1),
(2) Date: Mar. 2, 2015

(87) PCT Pub. No.: WO2014/034068
PCT Pub. Date: Mar. 6, 2014

(65) Prior Publication Data
US 2015/0229500 A1 Aug. 13, 2015

(30) Foreign Application Priority Data
Sep. 3, 2012 (JP) ................................. 2012-193248

(51) Int. Cl.
*H04B 1/38* (2015.01)
*H04L 27/18* (2006.01)
(Continued)

(52) U.S. Cl.
CPC .............. *H04L 27/18* (2013.01); *H01Q 1/3275* (2013.01); *H01Q 3/26* (2013.01); *H01Q 21/28* (2013.01);
(Continued)

(58) Field of Classification Search
CPC ............ H04B 1/40; H04B 3/23; H04B 1/403; H04L 27/2601; H04L 1/0025
USPC ......................................... 375/219, 295, 316
See application file for complete search history.

(56) References Cited

U.S. PATENT DOCUMENTS

2005/0122262 A1* 6/2005 Ahn ......................... H01Q 1/32
342/359
2007/0087787 A1 4/2007 Washiro
(Continued)

FOREIGN PATENT DOCUMENTS

JP H09200115 A 7/1997
JP 2001-345746 12/2001
(Continued)

OTHER PUBLICATIONS

International Search Report and Written Opinion (in Japanese with English Translation) for PCT/JP2013/004992, mailed Sep. 24, 2013; ISA/JP.

(Continued)

*Primary Examiner* — Zewdu Kassa
(74) *Attorney, Agent, or Firm* — Harness, Dickey & Pierce, P.L.C.

(57) ABSTRACT

A wireless communication apparatus includes multiple antennas, a receiver for performing diversity reception using the antennas, a transmitter, a selector circuit connected to the antennas, a divider, and a phase shifter. The divider is located in a transmission line which connects the selector circuit to the transmitter and distributes a signal outputted from the transmitter among the antennas during transmission. The phase shifter is located in at least one of multiple transmission lines, each of which connects the divider to a corresponding one of the antennas.

7 Claims, 16 Drawing Sheets

(51) Int. Cl.
- *H01Q 3/26* (2006.01)
- *H04B 7/08* (2006.01)
- *H01Q 1/32* (2006.01)
- *H01Q 21/28* (2006.01)
- *H04B 7/06* (2006.01)
- *H04B 7/10* (2006.01)
- *H04B 1/40* (2015.01)
- *H04B 1/04* (2006.01)

(52) U.S. Cl.
CPC .. *H04B 1/40* (2013.01); *H04B 7/06* (2013.01); *H04B 7/0617* (2013.01); *H04B 7/08* (2013.01); *H04B 7/10* (2013.01); *H04B 2001/0408* (2013.01)

(56) References Cited

U.S. PATENT DOCUMENTS

2008/0278329 A1* 11/2008 Kim ................... H04B 5/0062 340/572.4
2010/0081446 A1* 4/2010 Ushiki ............. H04W 56/0015 455/450
2012/0025965 A1* 2/2012 Mochizuki ............. B60Q 9/008 340/435

FOREIGN PATENT DOCUMENTS

| | | |
|---|---|---|
| JP | 2005072782 A | 3/2005 |
| JP | 2005286918 A | 10/2005 |
| JP | 2007527125 A | 9/2007 |
| JP | 2009077015 A | 4/2009 |
| JP | 2011250108 A | 12/2011 |
| WO | WO-2006021235 A1 | 3/2006 |

OTHER PUBLICATIONS

Office Action dated Jun. 30, 2015 in corresponding JP Application No. 2012-193248.

* cited by examiner

WIRELESS COMMUNICATION APPARATUS

CROSS REFERENCE TO RELATED APPLICATIONS

This application is a U.S. National Phase Application under 35 U.S.C. 371 of International Application No. PCT/JP2013/004992 filed on Aug. 23, 2013 and published in Japanese as WO 2014/034068 A1 on Mar. 6, 2014. This application is based on and claims the benefit of priority from Japanese Patent Application No. 2012-193248 filed on Sep. 3, 2012. The entire disclosures of all of the above applications are incorporated herein by reference.

TECHNICAL FIELD

The present disclosure relates to wireless communication apparatus for wirelessly performing transmission and reception and, in particular, relates to a wireless communication apparatus capable of performing diversity reception.

BACKGROUND ART

A wireless communication apparatus capable of performing diversity reception is widely known (for example, a patent literature 1). The wireless communication apparatus disclosed in the patent literature 1 has two antenna elements and selects any one of the two antenna elements used for reception by a selector switch so that antenna directivity as a whole can be changed.

PRIOR ART LITERATURES

Patent Literature

Patent Literature 1: JP 2005-72782A

SUMMARY OF INVENTION

However, although two antennas are included for performing diversity reception, transmission is performed by using only one of the antennas. Therefore, transmission performance is insufficient.

In view of the above, it is an object of the present disclosure to improve transmission performance of a wireless communication apparatus capable of performing diversity reception.

According to an aspect of the present disclosure, a wireless communication apparatus includes multiple antennas and performs diversity reception using the antennas. The wireless communication apparatus includes a receiver, a transmitter, a selector circuit connected to the antennas, a divider located in a transmission line which connects the selector circuit to the transmitter and configured to distribute a signal outputted from the transmitter among the antennas during transmission, and a phase shifter located in at least one of multiple transmission lines, each of which connects the divider to a corresponding one of the antennas.

As described above, according to the aspect of the present disclosure, the divider connects the transmitter to multiple antennas, and transmission is performed by using the antennas which are also used to perform diversity reception. Further, the phase shifter is located in at least one of the transmission lines, each of which connects the divider to a corresponding one of the antennas. Since a combined directivity can be changed by adjusting the phase shift amount caused by the phase shifter, directivity can be set appropriately, for example, according to an angle of a mount condition. Accordingly, transmission performance can be improved.

BRIEF DESCRIPTION OF THE DRAWINGS

The above and other objects, features and advantages of the present disclosure will become more apparent from the following detailed description made with reference to the accompanying drawings. In the drawings.

EMBODIMENTS FOR CARRYING OUT INVENTION

Below, embodiments of the present disclosure are described with reference to the drawings.

(First Embodiment)

Figure 1:
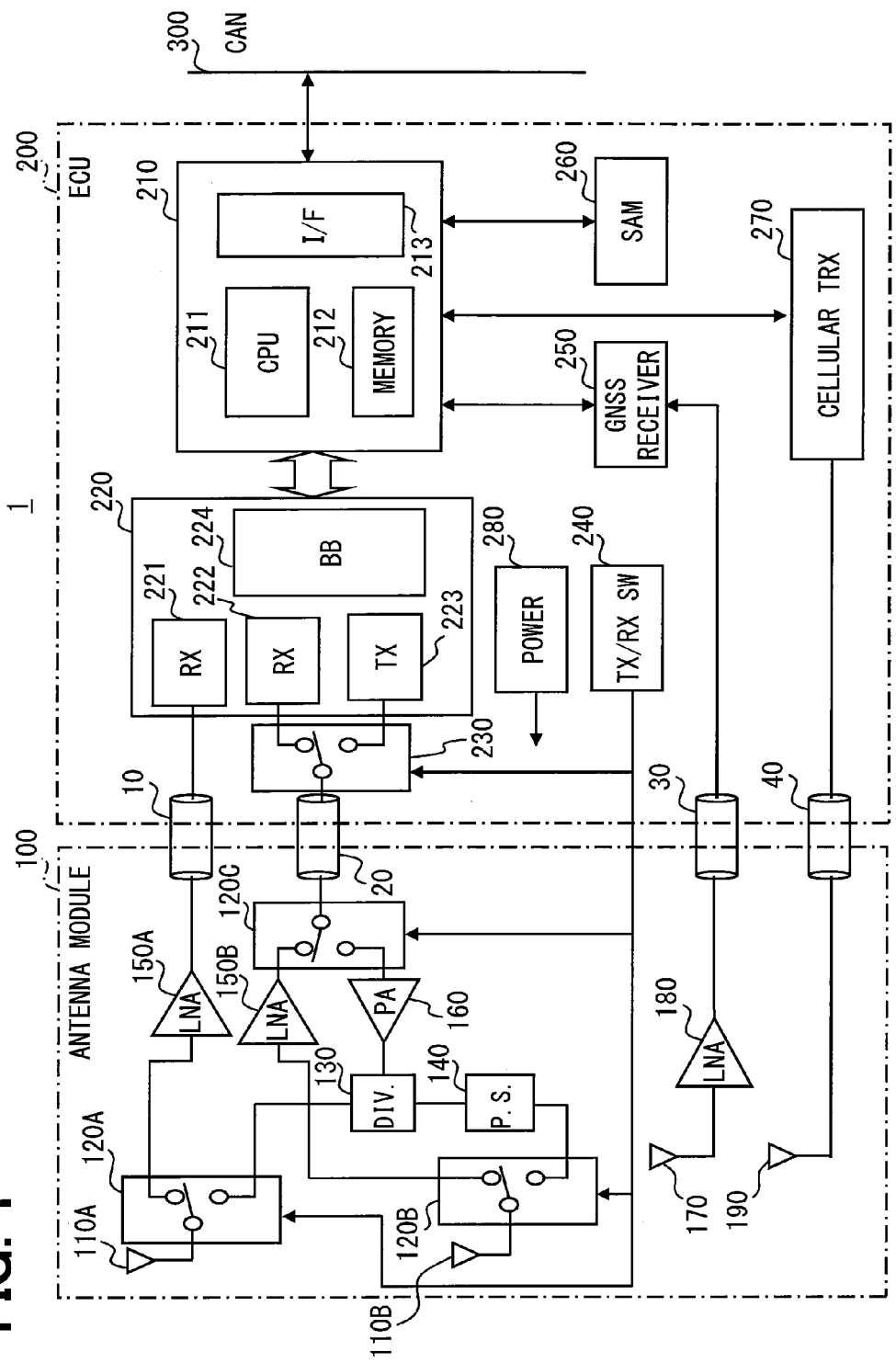
FIG. 1 is a diagram illustrating a structure of a vehicular wireless communication apparatus 1 according to a first embodiment.

As shown in FIG. 1, a vehicular wireless communication apparatus 1 includes an antenna module 100 and an ECU 200 and performs at least one of vehicle-to-vehicle communication and vehicle-to-road-side communication. For example, a communication frequency of a 5.9 GHz band can be used for vehicle-to-vehicle communication and vehicle-to-road-side communication.

Firstly, a structure of the antenna module 100 is described. For vehicle-to-vehicle communication and vehicle-to-road-side communication, the antenna module 100 includes two antennas 110A and 110B, three selector circuits 120A, 120B, and 120C, a divider 130, a phase shifter 140, and two low-noise amplifiers 150A and 150B, and a power amplifier 160.

In addition, the antenna module 100 includes a GNSS (Global Navigation Satellite Systems) antenna 170, a low-noise amplifier 180, and a cellular phone antenna 190. The GNSS antenna 170 is connected to the low-noise amplifier 180, and the low-noise amplifier 180 is connected to a coaxial cable 30. The cellular phone antenna 190 is connected to a coaxial cable 40.

The two antennas 110A and 110B are used for both reception and transmission. During reception, the selector circuit 120A connects the antenna 110A and the low-noise amplifier 150A. The low-noise amplifier 150A is connected to the ECU 200 through a coaxial cable 10.

Further, during reception, the selector circuit 120B connects the antenna 110B and the low-noise amplifier 150B. Further, during reception, the selector circuit 120C connects the low-noise amplifier 150B and a coaxial cable 20. Thus, during reception, the two antennas 110A and 110B are used. It is noted that a connection position of each of the selector circuits 120A, 120B, and 120C is changed by an antenna selector switch 240 of the ECU 200.

During transmission, the selector circuit 120C connects the coaxial cable 20 and the power amplifier 160. The power amplifier 160 is connected to the divider 130. The divider 130 distributes an input signal from the power amplifier 160 between the antenna 110A and the antenna 110B.

The selector circuit 120A is located between the divider 130 and the antenna 110A. During transmission, the selector circuit 120A connects the divider 130 and the antenna 110A. The selector circuit 120B is located between the divider 130 and the antenna 110B. During transmission, the selector circuit 120B connects the divider 130 and the antenna 110B.

In addition to the selector circuit 120B, the phase shifter 140 is also located between the divider 130 and the antenna 110B and located closer to the divider 130 than the selector circuit 120B. A signal which is phase-shifted by the phase shifter 140 is transmitted to the antenna 110B. In contrast, there is no phase shifter between the antenna 110A and the divider 130. Thus, a phase of a radio wave transmitted by the antenna 110A is different from a phase of a radio wave transmitted by the antenna 110B.

Next, a structure of the ECU 200 is described. The ECU 200 includes a processor 210, a communication chip 220, a selector circuit 230, the antenna selector switch 240, a GNSS receiver 250, a security access module (SAM) 260, a cellular transceiver 270, and a power source 280.

The GNSS receiver 250 is connected through the coaxial cable 30 to the GNSS antenna 170, generates reception data by filtering, amplifying, and demodulating a signal supplied from the GNSS antenna 170, and supplies the reception data to the processor 210. The SAM 260 encrypts and decrypts signals transmitted and received through vehicle-to-vehicle communication or vehicle-to-road-side communication. The cellular transceiver 270 is connected through the coaxial cable 40 to the cellular phone antenna 190 and capable of connecting to a cellular phone line. Transmission data to the cellular phone line is inputted from the processor 210, and reception data from the cellular phone line is outputted to the processor 210. The power source 280 supplies electric power to internal components of the ECU 200 and also supplies electric power to components of the antenna module 100.

The processor 210 includes a CPU 211, a memory 212, and an interface (I/F) 213. The memory 212 is nonvolatile and stores phase shift amount information which is described later. Although not shown in the drawings, a volatile memory is also included. The I/F 213 is connected to a CAN 300 which is an in-vehicle communication network. The processor 210 obtains various kinds of information of a vehicle through the I/F 213 and the CAN 300 and also supplies various kinds of information to devices mounted on the vehicle.

The communication chip 220 includes two receivers 221 and 222, a transmitter, and a baseband section 224. According to the present embodiment, vehicle-to-vehicle communication and vehicle-to-road-side communication are performed in accordance with a communication standard defined by IEEE802.11p.

The receiver 221 is connected to the coaxial cable 10, and a signal received by the antenna 110A is inputted to the receiver 221 through the coaxial cable 10. The receiver 221 filters and amplifies the input signal and then sends it to the baseband section 224. The receiver 222 has the same function as the receiver 221. The receiver 222 is connected to the antenna 110B through the selector circuit 230 and the coaxial cable 20.

The transmitter 223 is also connected to the selector circuit 230. The selector circuit 230 selects one of a state where the receiver 222 is connected to the coaxial cable 20 and a state where the transmitter 223 is connected to the coaxial cable 20. The connection state selected by the selector circuit 230 is changed by the antenna selector switch 240. The antenna selector switch 240 selects one of transmission and reception based on a communication condition of the communication chip 220. The baseband section 224 performs modulation and demodulation. During reception, diversity reception is performed (maximum ratio combining diversity here).

The communication chip 220 is capable of communicating with the processor 210. During both reception and transmission of radio waves, the communication chip 220 and the processor 210 communicate with each other.

Figure 2:
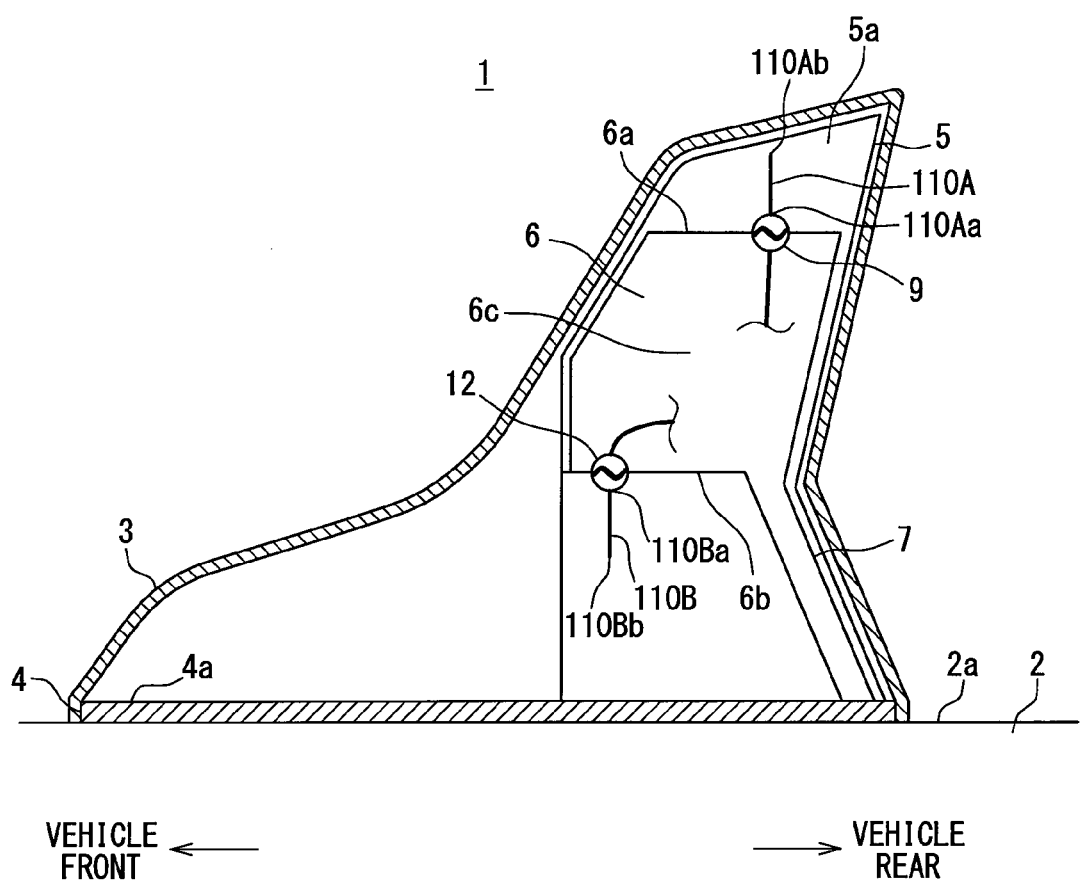
FIG. 2 is a partial cross-sectional diagram illustrating a condition where the vehicular wireless communication apparatus 1 is mounted on a vehicle roof 2.

FIG. 2 shows a manner in which the vehicular wireless communication apparatus 1 is installed. This figure is intended to show a positional relationship among the antennas 110A and 110B and a roof 2 of the vehicle, and therefore leaves out the ECU 200 and the components of the antenna module 100 except for the antennas 110A and 110B.

As shown in FIG. 2, from an outer design perspective, the vehicular wireless communication apparatus 1 has a streamlined shape (what is called a shark fin shape) in a direction from the front to the rear of the vehicle.

A ground plane has an almost rectangular planar shape and is made of a metal plate. The ground plane 4 extends along a roof surface 2a of the vehicle roof 2 under a condition where the vehicular wireless communication apparatus 1 is installed on the roof surface 2a of the vehicle roof 2. A planar board 5 made of resin is almost vertically (not limited to perfectly vertically) stood on a ground plane surface 4a which is a top surface of the ground plane 4.

An antenna ground 6 is formed as a conductor pattern (conductor film) on a first surface 5a of the board 5. Further, a connector 7 for electrically connecting the antenna ground 6 and the ground plane 4 is formed as a conductor pattern on the first surface 5a of the board 5. That is, the antenna ground 6 is spaced by a predetermined distance from the ground plane surface 4a of the ground plane 4 and has the same potential as the ground plane 4 because of the connector 7. It is noted that the antenna ground 6 is rectangular and has predetermined widths in both vertical and horizontal directions.

The antenna 110A is connected to a top end 6a of the antenna ground 6. The antenna 110A is a linear monopole antenna for transmitting and receiving vertically polarized waves, and a base end 110Aa is electrically connected.

The antenna 110A is connected in such a manner that a distance between the antenna 110A and the antenna ground 6 increases in an almost vertically direction from its base end 110Aa to its tip end 110Ab. A length (element length) of the antenna 110A is electrically equal to a "¼" wavelength and can be determined by multiplying a wavelength of a radio wave of a frequency of, for example, 5.9 GHz band by "¼" and a wavelength shortening ratio depending on a relative permittivity of a material of which the board 5 is made.

The base end 110Aa of the antenna 110 is provided with a feeding point 9 from which the antenna 110A is supplied with electric power. The antenna 110A is positioned so that a height of the base end 110Aa from the ground plane surface 4a can be about 40 [mm].

Likewise, the antenna 110B is connected to a bottom end 6b of the antenna ground 6. The antenna 110B is also a linear monopole antenna for transmitting and receiving vertically polarized waves, and a base end 110Ba is electrically connected.

The antenna 110B is connected in such a manner that a distance between the antenna 110B and the antenna ground 6 increases in an almost vertically direction from its base end 110Ba to its tip end 110Bb. A length (element length) of the antenna 110B is electrically equal to a "¼" wavelength and can be determined by multiplying a wavelength of a radio wave of a frequency of, for example, 5.9 GHz band by "¼" and a wavelength shortening ratio depending on a relative permittivity of a material of which the board 5 is made.

The base end 110Ba of the antenna 110B is provided with a feeding point 12 from which the antenna 110B is supplied with electric power. The antenna 110B is positioned so that a height of the base end 110Ba from the ground plane surface 4a can be about 20 [mm].

Each of axes of the antennas 110A and 110B is misaligned with a center portion 6c of the antenna ground 6 in the horizontal direction. It is preferable that a width of the antenna ground 6 in the horizontal direction should be greater than a length which is calculated by multiplying a wavelength of a radio wave of a frequency of, for example, 5.9GHz band by "¼" and a wavelength shortening ratio depending on a relative permittivity of a material of which the board 5 is made. Further, in order to reduce correlation between the antennas 110A and 110B as space diversity, it is preferable that a distance between the feeding points 9 and 12 should be greater than a length which is calculated by multiplying a wavelength of a radio wave of a frequency of, for example, 5.9GHz band by "¼" and a wavelength shortening ratio depending on a relative permittivity of a material of which the board 5 is made.

Figure 3A:
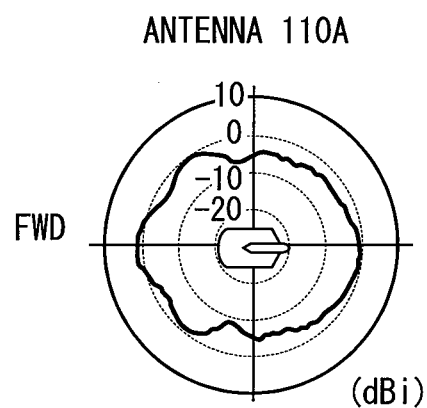
FIG. 3A shows a result of simulation conducted to assess a horizontal plane (X-Y plane) directivity of an antenna 110A shown in FIG. 2.
Figure 3B:
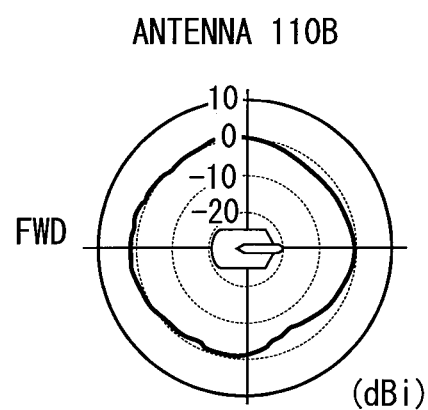
FIG. 3B shows a result of simulation conducted to assess a horizontal plane (X-Y plane) directivity of an antenna 110B shown in FIG. 2.

FIGS. 3A and 3B shows results of simulations conducted to assess horizontal plane directivities of the antennas 110A and 110B, respectively. As shown in FIG. 3A, the simulation result of the horizontal plane directivity of the antenna 110A is that LIN.AVG=−2.7 dBi, AVG=−3.2 dBi, MAX=0.9 dBi, and MIN=−8.5 dBi. As shown in FIG. 3B, the simulation result of the horizontal plane directivity of the antenna 110B is that LIN.AVG=−1.0 dBi, AVG=−1.2 dBi, MAX=1.3 dBi, and MIN=−5.1 dBi. However, according to the present embodiment, instead of selectively using one of the antennas 110A and 110B having the directivities respectively shown in FIGS. 3A and 3B, radio waves are emitted from the two antennas 110A and 110B while the phase shifter 140 causes their phases to differ from each other.

The phase shifter 140 adjusts the phase emitted from the antenna 110B so that a combined emission characteristic (combined directivity) into which the emissions from the two antennas 110A and 110B are combined can be changed.

Further, as shown in FIG. 2, the two antennas 110A and 110B are located at different positions in the horizontal direction and also located at different positions in a front-rear direction of the vehicle. When the two antennas 110A and 110B are arranged in this manner, both horizontal plane directivity and vertical plane directivity can be changed by producing the phase difference using the phase shifter 140.

Figure 4:
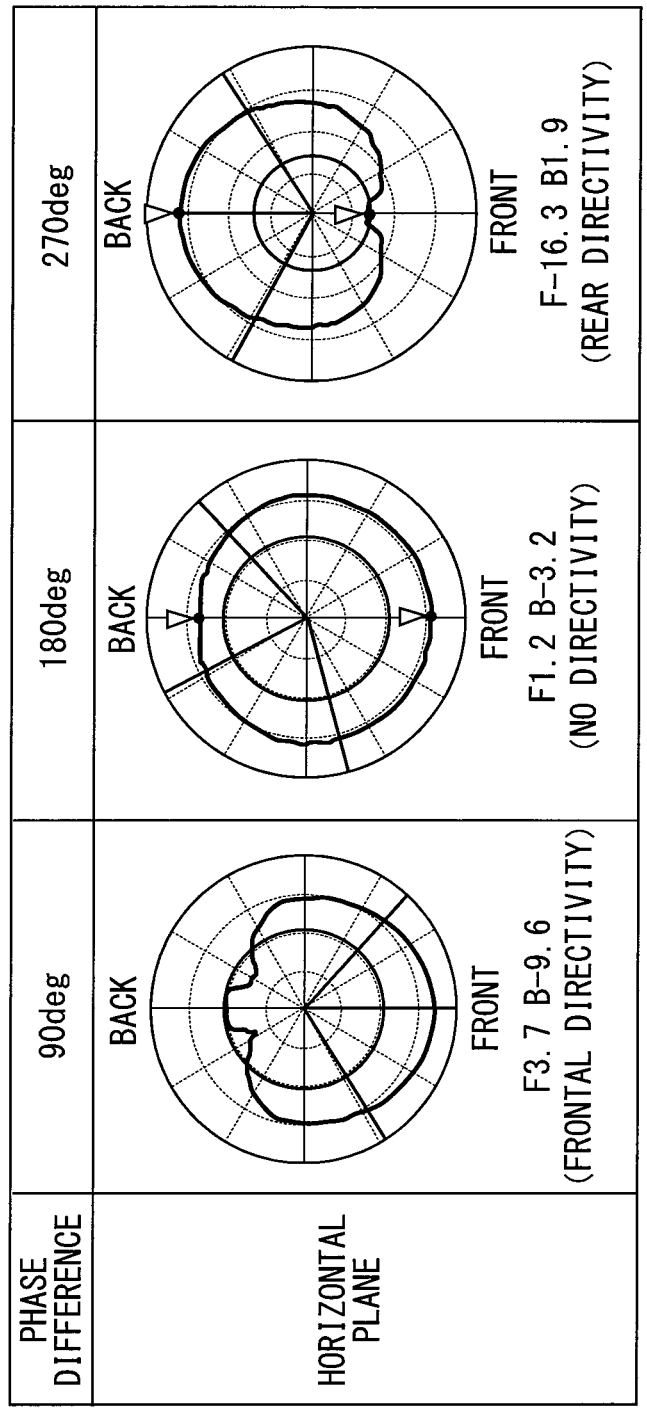
FIG. 4 shows a change in a combined directivity in a horizontal plane according to the first embodiment.
Figure 5:
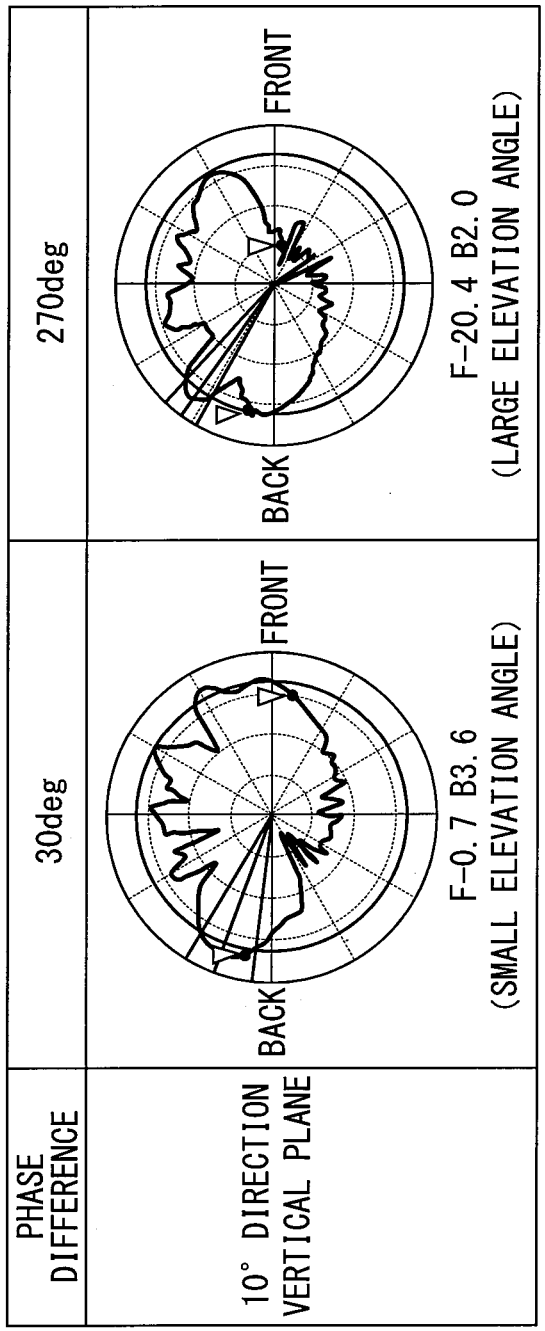
FIG. 5 shows a change in a combined directivity in a vertical plane according to the first embodiment.

FIG. 4 shows a change in the horizontal plane directivity. FIG. 5 shows a change in the vertical plane directivity. Both FIGS. 4 and 5 show cases where the phase of the antenna 110B, which is located on the lower side, is advanced. As can be seen from FIG. 4, the horizontal plane directivity can be set to frontal directivity, no directivity, or rear directivity by adjusting the phase difference by using the phase shifter 140. The no directivity is not limited to absolutely no directivity, but can include almost no directivity.

Further, as can be seen from FIG. 5, the vertical plane directivity can be set to a small elevation angle or a large elevation angle.

As described above, according to the first embodiment, the vehicular wireless communication apparatus 1 includes the divider 130 and performs transmission by using both of the two antennas 110A and 110B which are also used to perform diversity reception. Further, the phase shifter 140 is located between the antenna 110B and the divider 130, and the combined directivity is changed by adjusting the phase shift amount of the phase shifter 140. Thus, the directivity can be set appropriately, for example, according to an angle of the mount condition so that transmission performance can be improved.

(Second Embodiment)

Next, a second embodiment is described. In the description of the second embodiment, the same reference characters already used in the preceding embodiment indicate the same parts in the preceding embodiment unless otherwise stated.

Figure 6:
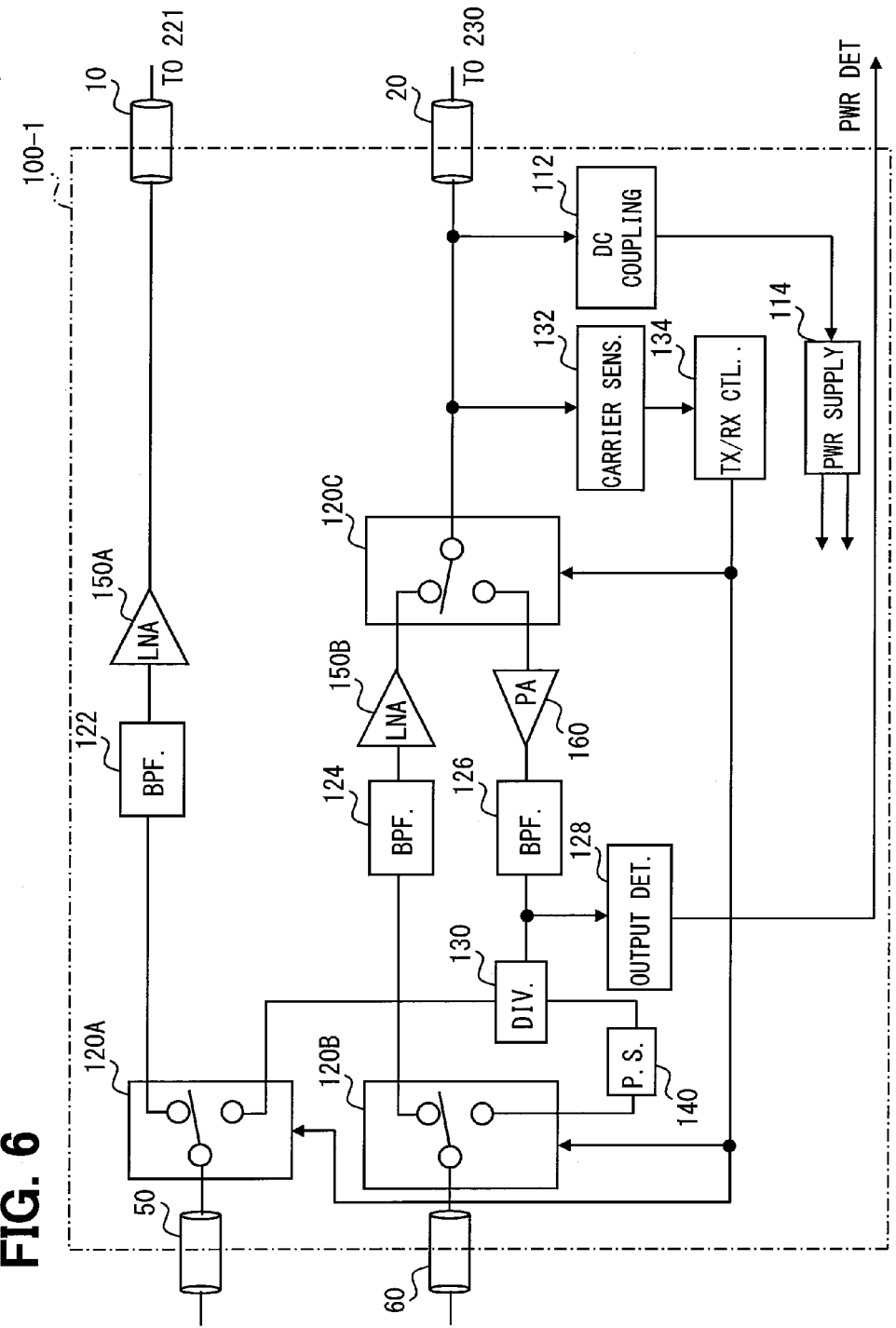
FIG. 6 is a diagram illustrating a structure of an antenna module 100-1 according to a second embodiment.

As shown in FIG. 6, according to the second embodiment, an antenna module 100-1 includes the whole structure of the antenna module 100 of the first embodiment. The antenna module 100-1 further includes a DC coupling section 112, a power source 114, three bandpass filters (BPF) 122, 124, and 126, a transmission power detector 128, a carrier sensor 132, and a selector controller 134. The antenna 110A (not shown in FIG. 6) is connected through a coaxial cable 50 to the selector circuit 120A. The antenna 110B (not shown in FIG. 6) is connected through a coaxial cable 60 to the selector circuit 120B.

The DC coupling section 112 is connected to a signal line between the selector circuit 120C and the coaxial cable 20, and a signal of the signal line is inputted through the DC coupling section 112 to the power source 114.

The bandpass filters 122, 124, and 126 are located between the amplifiers 150A, 150B, and 160 and the antennas 110A and 110B to reduce unnecessary emission or to reduce interference with out-of-band signals. The transmission power detector 128 outputs a transmission power monitor signal to the communication chip 220 of the ECU 200. The communication chip 220 adjusts output power according to the transmission power monitor signal.

The selector controller 134 changes connection states of the selector circuits 120A-120C. The carrier sensor 132 detects a transmission signal inputted from the coaxial cable 20 and makes a determination of whether transmission is now being performed. The selector controller 134 controls the connection states of the selector circuits 120A-120C based on a result of the determination made by the carrier sensor 132. According to the second embodiment, since the selector controller 134 changes the connection states of the selector circuits 120A-120C, the ECU 200 does not have the antenna selector switch 240.

(Third Embodiment)

Figure 7:
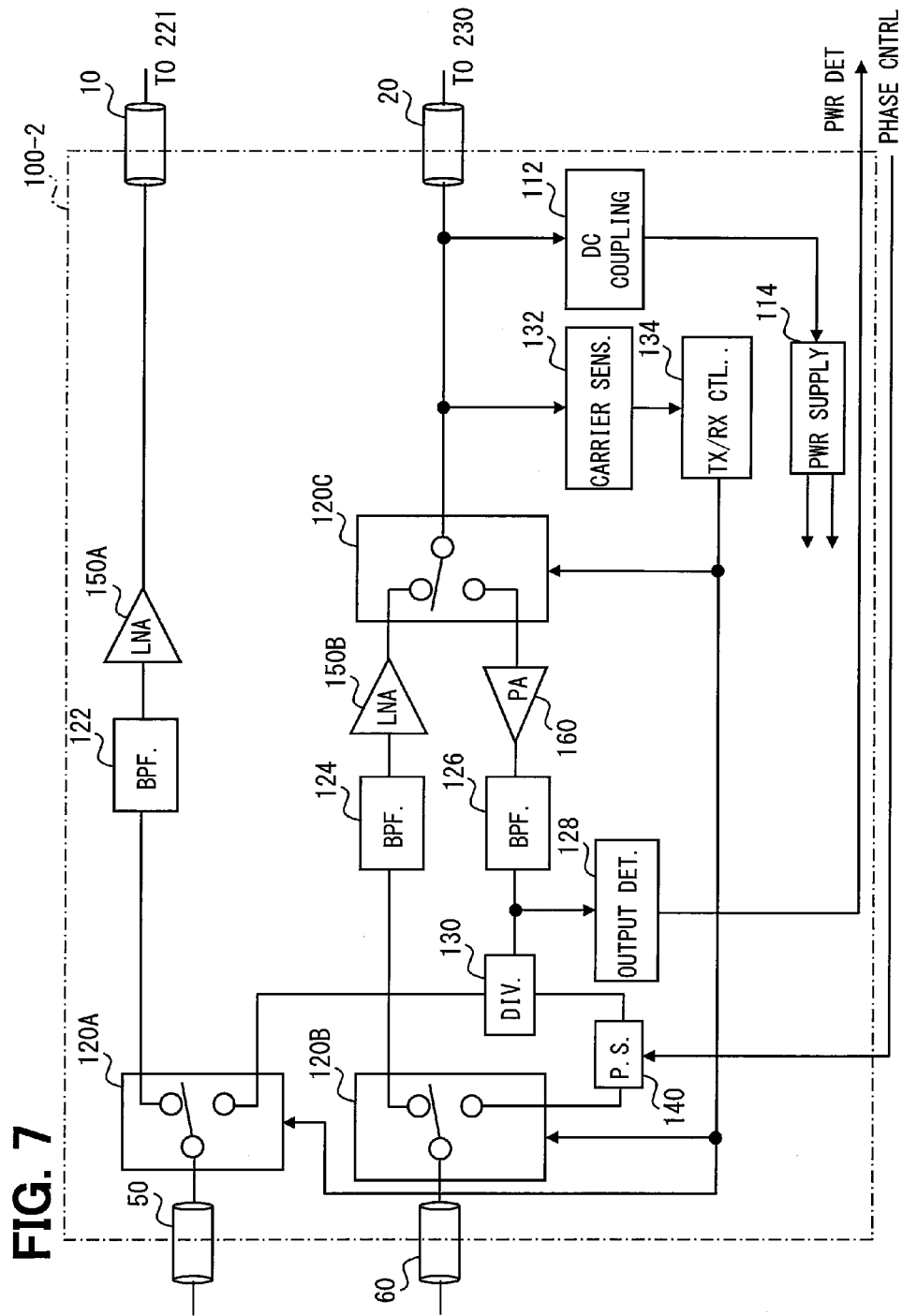
FIG. 7 is a diagram illustrating a structure of an antenna module 100-2 according to a third embodiment.

In an antenna module 100-2 shown in FIG. 7, the phase shifter 140 is configured so that the phase shift amount can be electronically controlled. A control value indicative of the phase shift amount is inputted to the phase shifter 140 from the ECU 200. The other structures are the same as those shown in FIG. 6.

According to a third embodiment, since the ECU 200 is capable of controlling the phase shift amount of the phase shifter 140, radio waves can be transmitted with directivity appropriate for communication environment after installation on the vehicle.

(Fourth Embodiment)

Figure 8:
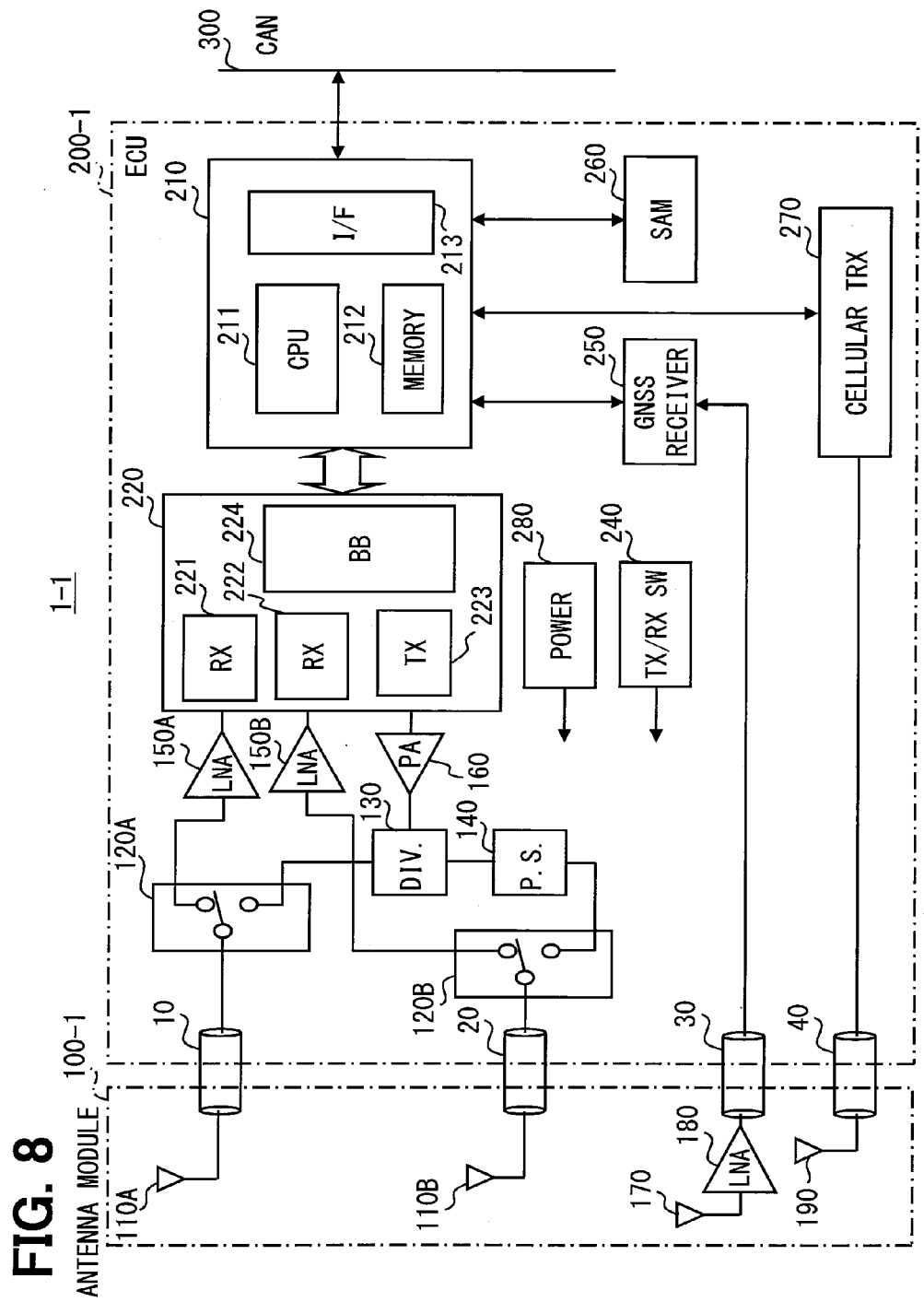
FIG. 8 is a diagram illustrating a structure of a vehicular wireless communication apparatus 1-1 according to a fourth embodiment.

FIG. 8 shows a vehicular wireless communication apparatus 1-1 according to a fourth embodiment. As shown in FIG. 8, according to the fourth embodiment, the selector circuits 120A and 120B, the divider 130, the phase shifter 140, the low-noise amplifiers 150A and 150B, and the power amplifier 160, which are included in the antenna module 100 in the first embodiment, are included in an ECU 200-1.

Like in the fourth embodiment, the divider 130, the phase shifter 140, and the transmission amplifiers (the low-noise amplifiers 150A and 150B, and the power amplifier 160) can be included in the ECU 200-1.

(Fifth Embodiment)

Figure 9:
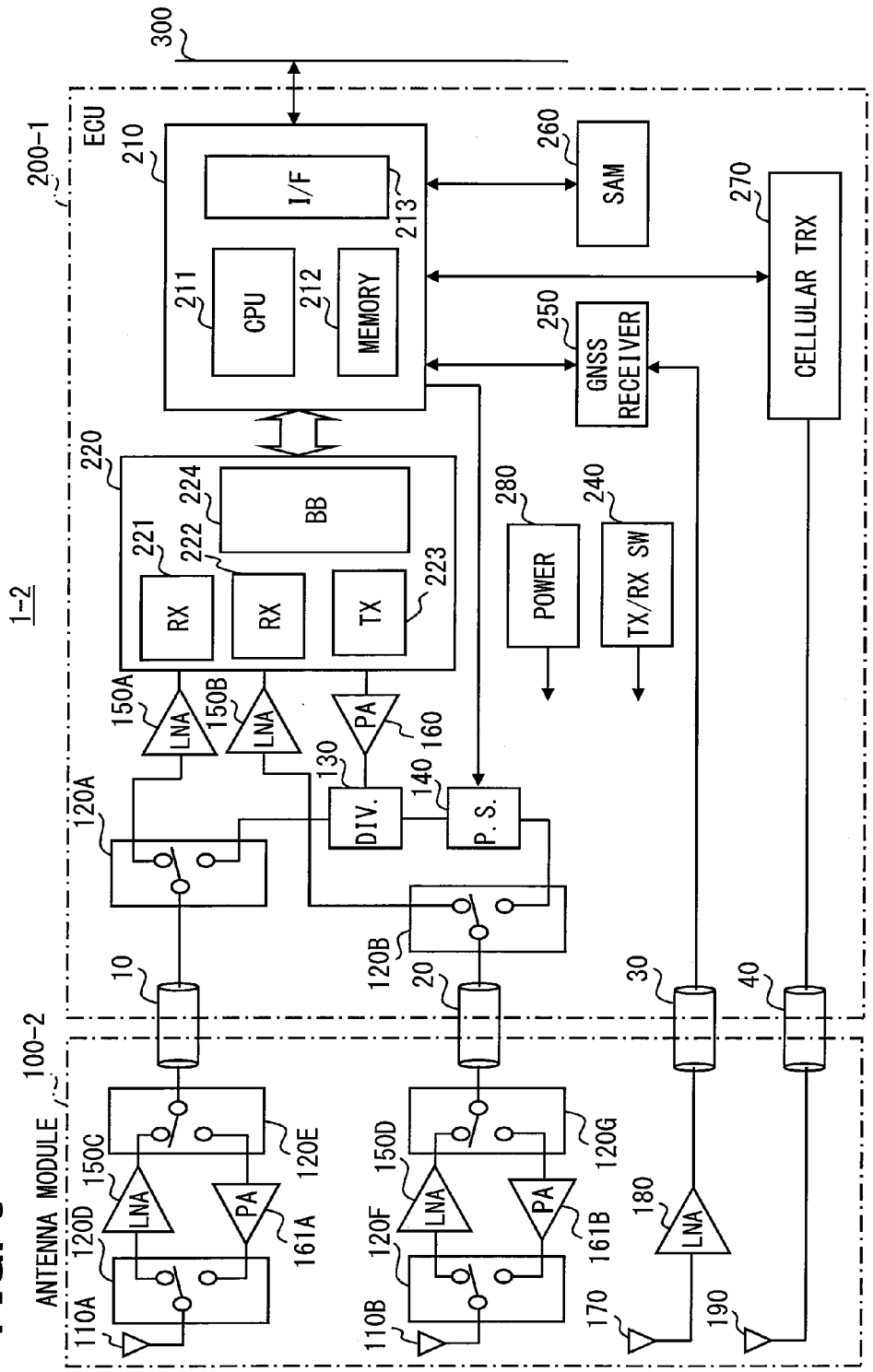
FIG. 9 is a diagram illustrating a structure of a vehicular wireless communication apparatus 1-2 according to a fifth embodiment.

According to a fifth embodiment shown in FIG. 9, the phase shifter 140 is configured so that the phase shift amount can be electronically controlled. A control value indicative of the phase shift amount is inputted to the phase shifter 140 from the processor 210.

Like in the preceding embodiments, an antenna module 100-2 includes two antennas 110A and 110B. The antenna 110A is provided with two selector circuits 120D and 120E, one low-noise amplifier 150C, and one power amplifier 161A, and the antenna 110B is provided with two selector circuits 120F and 120G, one low-noise amplifier 150D, and one power amplifier 161B.

Although not shown in FIG. 9, connection states of the four selector circuits 120D-120G are controlled by the antenna selector switch 240 of an ECU 200-1.

During transmission, the antenna 110A is connected to the power amplifier 161A through the selector circuits 120D and 120E, and the antenna 110B is connected to the power amplifier 161B through the selector circuits 120F and 120G.

Since the two antennas 110A and 110B are respectively connected to the power amplifiers 161A and 161B during transmission, total transmission power can be increased easily. However, in this structure, the phase shift amount varies depending on a difference in length between the coaxial cables 10 and 20 and depending on a difference in characteristic between the power amplifiers 161A and 161B. Therefore, the processor 210 adjusts the phase shift amount of the phase shifter 140.

(Sixth Embodiment)

An embodiment described below relates to a method of setting the phase shift amount of the phase shifter 140. The embodiment described below can be applied to any of the preceding embodiments where the phase shift amount of the phase shifter 140 can be adjusted. The processor 210 of the ECU 200 executes each step of flowcharts explained below except a step of inputting the phase shift amount.

Figure 10:
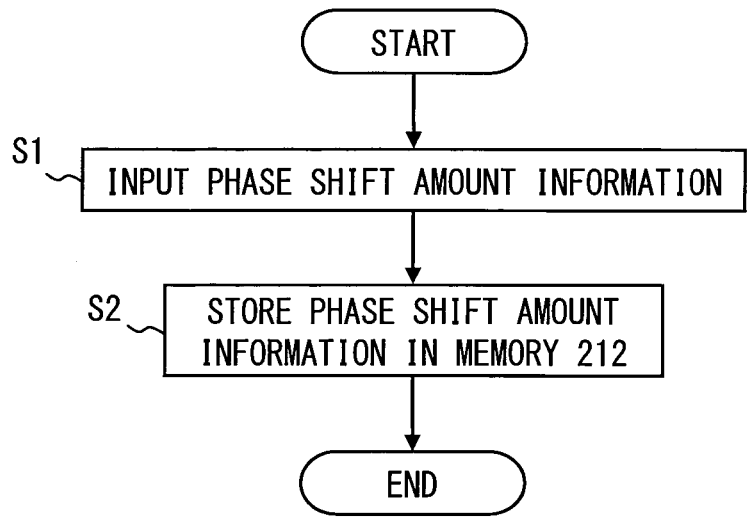
FIG. 10 is a flowchart of a process executed to store a phase shift amount according to a sixth embodiment.
Figure 11:
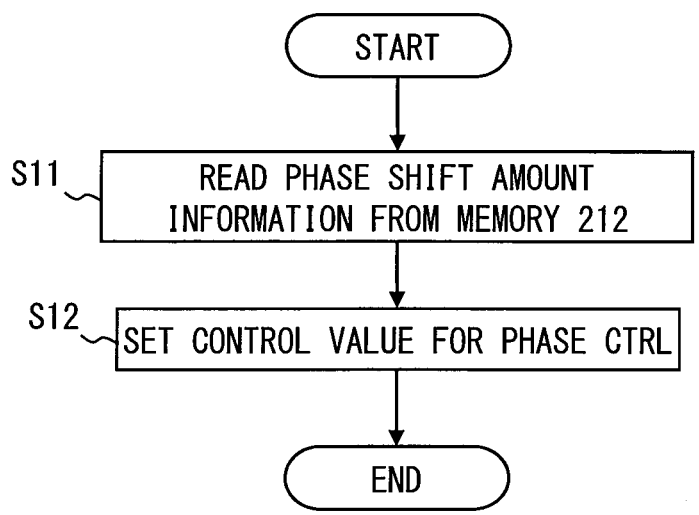
FIG. 11 is a flowchart of a process executed to set the phase shift amount according to the sixth embodiment.

According to the sixth embodiment, a process shown in FIG. 10 is performed before communication such as during manufacture and during installation, and a process shown in FIG. 11 is performed during actual communication. In FIG. 1, at step S1, a worker inputs phase shift amount information using a predetermined input device. The inputted phase shift amount information is stored in the memory 212 (step S2).

During communication, as shown in FIG. 11, the inputted phase shift amount information is read from the memory 212 (step S11), and a control value used to control the shift amount control is set based on the read phase shift amount information (step S12). The control value is inputted to the phase shifter 140.

(Seventh Embodiment)

Figure 12:
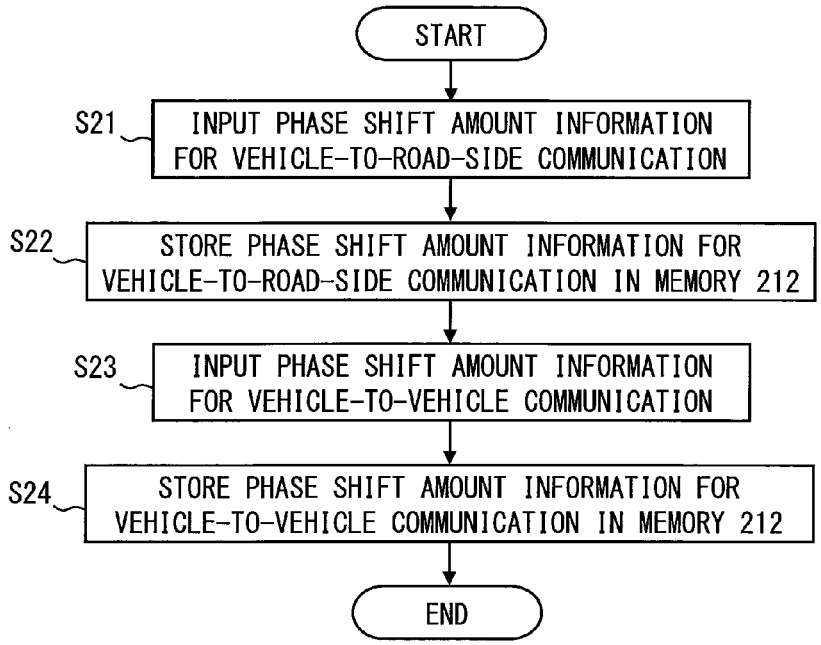
FIG. 12 is a flowchart of a process executed to store a phase shift amount according to a seventh embodiment.
Figure 13:
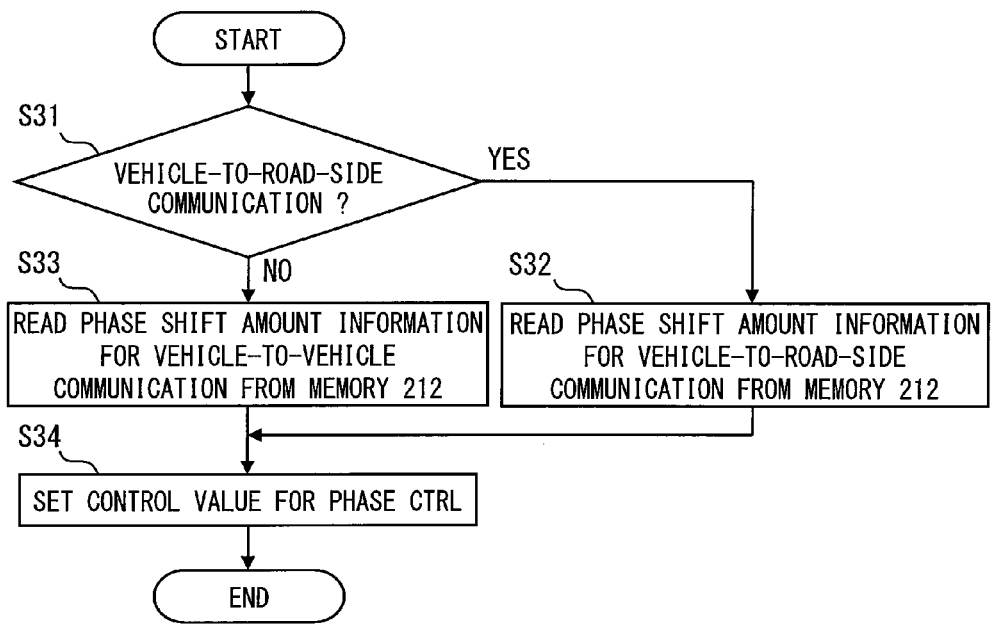
FIG. 13 is a flowchart of a process executed to set the phase shift amount according to the seventh embodiment.

According to a seventh embodiment, processes shown in FIGS. 12 and 13 are performed instead of those shown in FIGS. 10 and 11. Like FIG. 10, FIG. 12 is performed in advance before communication. At step S21, phase shift amount information for vehicle-to-road-side communication is inputted. The inputted phase shift amount information for vehicle-to-road-side communication is stored in the memory 212 (step S22).

Then, phase shift amount information for vehicle-to-vehicle communication is inputted (step S23). The inputted phase shift amount information for vehicle-to-vehicle communication is also stored in the memory 212 (step S24). It is noted that appropriate values for the phase shift amount information for vehicle-to-road-side communication and the phase shift amount information for vehicle-to-vehicle communication are experimentally determined in advance.

During communication, as shown in FIG. 13, it is determined whether it is vehicle-to-road-side communication. For example, this determination is made based on kinds of a transmission signal. If the signal is directed to other vehicles, the determination is YES, and if the signal is directed to a roadside device, the determination is NO. This determination can be made based on various conditions (for example, a location or whether an in-vehicle device or a road-side device has a transmitter which transmits a reception signal) before the transmission signal is decided.

If it is vehicle-to-road-side communication (S31: YES), the phase shift amount information for vehicle-to-road-side communication is read from the memory 212 (step S32). In contrast, if it is vehicle-to-vehicle communication (S31: NO), the phase shift amount information for vehicle-to-road-side communication is read from the memory 212 (step S33).

After step S32 or S33 is executed, a control value used to control the phase shift amount is set based on the read phase shift amount information (step S34).

Thus, in the case of either vehicle-to-vehicle communication or vehicle-to-road-side communication, radio waves can be transmitted with transmission directivity appropriate for their communications by using the same antennas 110A and 110B.

(Eighth Embodiment)

Figure 14:
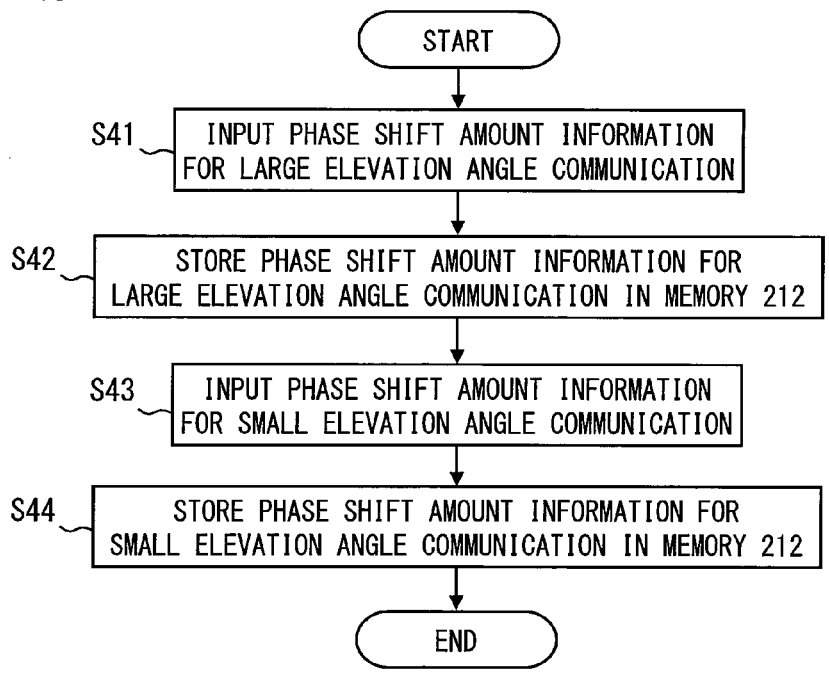
FIG. 14 is a flowchart of a process executed to store a phase shift amount according to an eighth embodiment.
Figure 15:
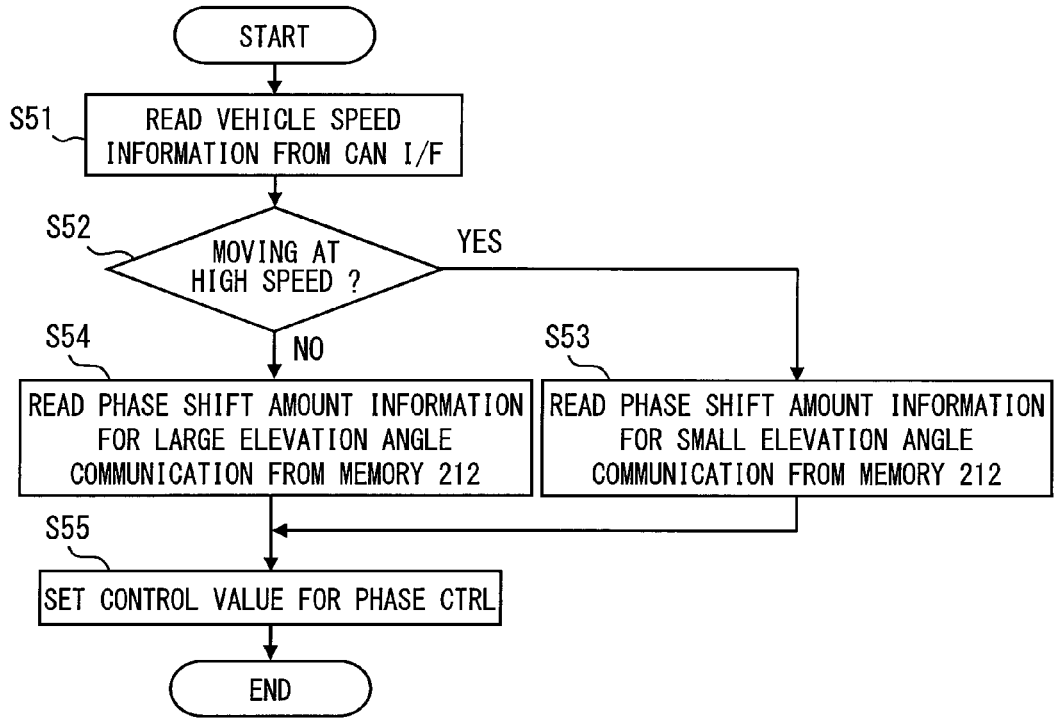
FIG. 15 is a flowchart of a process executed to set the phase shift amount according to the eighth embodiment.

According to a seventh embodiment, a process shown in FIG. 14 is performed instead of those shown in FIGS. 10 and 12, and a process shown in FIG. 15 is performed instead of those shown in FIGS. 11 and 13.

In FIG. 14, at step S41, phase shift amount information for large elevation angle communication is inputted. The inputted phase shift amount information for large elevation angle communication is stored in the memory 212 (step S42). At step S43, phase shift amount information for small elevation angle communication is inputted. The inputted phase shift amount information for small elevation angle communication is stored in the memory 212 (step S44). It is noted that the large elevation angle and the small elevation angle mean that one is larger or smaller in elevation angle than the other. For example, the phase shift amount information for large elevation angle communication and the phase shift amount information for small elevation angle communication can be phase differences 30° and 270° shown in FIG. 5.

During communication, as shown in FIG. 15, vehicle speed information is read firstly through the CAN 300 and the I/F 213 (step 51). Then, it is determined whether the vehicle is moving at high speed greater than a predetermined speed (step S52).

If it is determined that the vehicle is moving at high speed (S52: YES), the process proceeds to step S53 where the phase shift amount information for small elevation angle communication is read from the memory 212. In contrast, it is determined that the vehicle is not running at high speed (S52: NO), the process proceeds to step S54 where the phase shift amount information for large elevation angle communication is read from the memory 212.

At step S55, a control value used to control the phase shift amount is set based on the phase shift amount information read at step S53 or S54. A reason for determining whether the vehicle is moving at high speed is to determine whether the vehicle is moving inside a city area. A reason for selecting a large elevation angle when the vehicle is not moving at high speed (moving inside a city area) and selecting a small elevation angle when the vehicle is moving at high speed (moving outside a city area) is that it has been experimentally found that better communication can be achieved by selecting a large elevation angle when the vehicle is moving inside a city area.

The phase shift information is not limited to two kinds: the large elevation angle communication purpose and the small elevation angle communication purpose. Three or more kinds of phase shift information for different elevation angles can be stored in the memory 212, and the three or more kinds of phase shift information can be set according to the vehicle speed.

(Ninth Embodiment)

Figure 16:
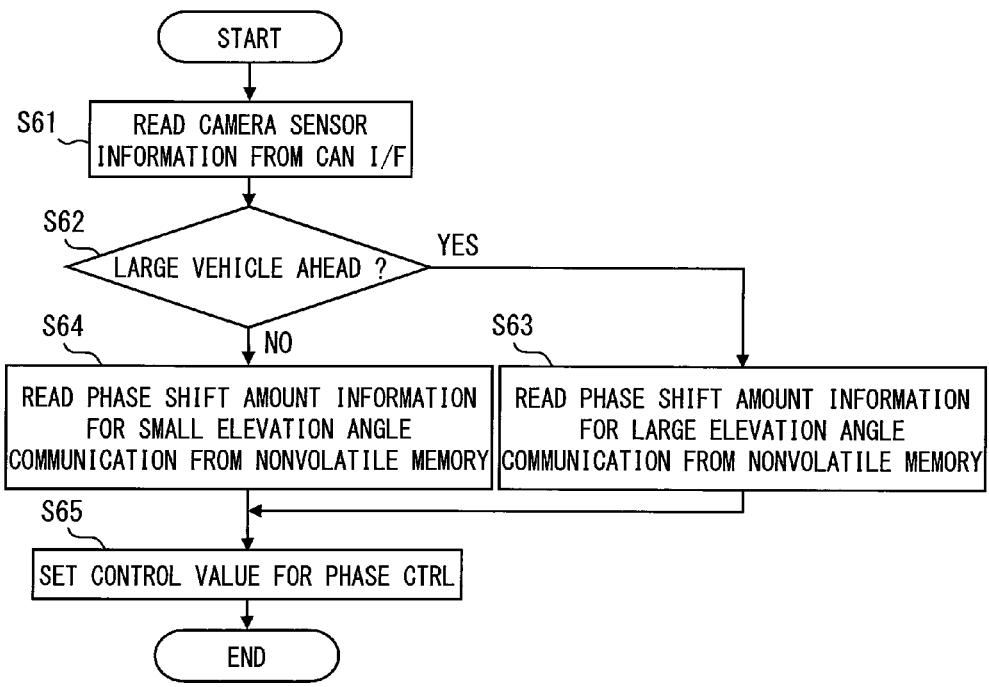
FIG. 16 is a flowchart of a process executed to set a phase shift amount according to a ninth embodiment.

According to a ninth embodiment, a process shown in FIG. 16 is performed instead of that shown in FIG. 15 of the eighth embodiment. The process shown in FIG. 14 is also performed in the ninth embodiment.

During communication, as shown in FIG. 16, camera sensor information is read firstly through the CAN 300 and the I/F 213 (step 61). Then, it is determined whether there is a large vehicle right ahead (whether a vehicle right ahead is a large vehicle) based on the camera sensor information (step S62).

If it is determined that there is a large vehicle ahead (S62: YES), the process proceeds to step S53 where the phase shift amount information for large elevation angle communication is read from the memory 212. In contrast, it is determined that there is no large vehicle ahead (S62: NO), the process proceeds to step S64 where the phase shift amount information for small elevation angle communication is read from the memory 212.

At step S65, a control value used to control the phase shift amount is set based on the phase shift amount information read at step S63 or S64. In such an approach, even when there is a large vehicle ahead, better communication can be achieved by preventing the large vehicle from obstructing radio waves. Further, when there is no large vehicle ahead, a small elevation angle is selected. Thus, communication distance can be increased compared to when a large elevation angle is selected.

In the ninth embodiment too, three or more kinds of phase shift information for different elevation angles can be stored in the memory 212. In this case, the three or more kinds of phase shift information can be set according to a height of a vehicle ahead. In addition to a height of a vehicle ahead, a distance to the vehicle ahead can be considered in such a manner that the phase shift information for a larger elevation angle can be used, as the height of the vehicle ahead is larger, and as the distance to the vehicle ahead is smaller.

(Tenth Embodiment)

Figure 17:
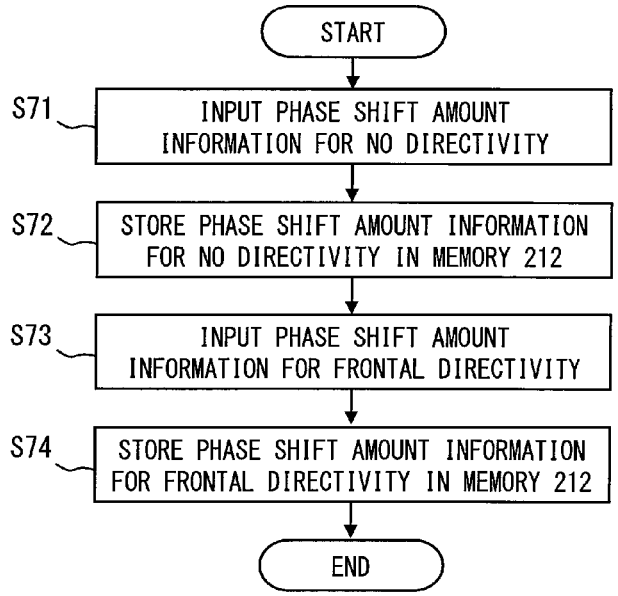
FIG. 17 is a flowchart of a process executed to store a phase shift amount according to a tenth embodiment.

According to a tenth embodiment, a process shown in FIG. 17 is performed in advance before communication. In FIG. 17, at step S71, the phase shift amount information for no directivity is inputted. The inputted phase shift amount information for no directivity is stored in the memory 212 (step S72). At step S73, the phase shift amount information for frontal directivity is inputted. The inputted phase shift amount information for frontal directivity is also stored in the memory 212 (step S74). For example, the phase shift amount information for no directivity and the phase shift amount information for frontal directivity can be phase differences 90° and 180° shown in FIG. 4.

Figure 18:
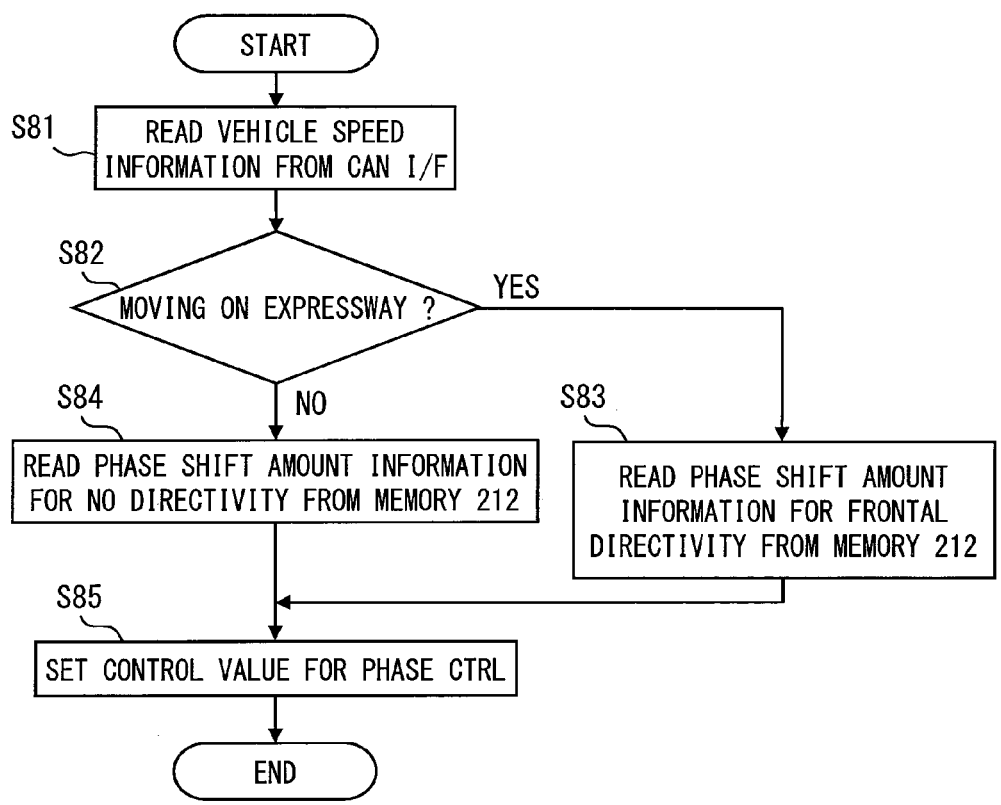
FIG. 18 is a flowchart of a process executed to set the phase shift amount according to the tenth embodiment.

During communication, as shown in FIG. 18, vehicle speed information is read firstly through the CAN 300 and the I/F 213 (step 81). Then, it is determined whether the vehicle is moving on an expressway (step S82). Instead of the vehicle speed information, map information and present location information can be used to determine whether the vehicle is moving on an expressway.

If it is determined that the vehicle is moving on an expressway (S82: YES), the process proceeds to step S83 where the phase shift amount information for frontal directivity is read from the memory 212. In contrast, it is determined that the vehicle is moving on an expressway (S82: NO), the process proceeds to step S84 where the phase shift amount information for no directivity is read from the memory 212.

At step S85, a control value used to control the phase shift amount is set based on the phase shift amount information read at step S83 or S84. A reason for selecting frontal directivity when the vehicle is moving on an expressway is that since a transmission target (vehicle or road-side device) exists only in the front and rear direction when the vehicle is moving on an expressway, there is no need to transmit radio waves in a cross direction.

According to the tenth embodiment, since directivity in the horizontal direction is changed based on whether the vehicle is moving on an expressway, better transmission performance can be achieved either when the vehicle is moving on an expressway or when the vehicle is moving on a road other than an expressway.

(Eleventh Embodiment)

Figure 19:
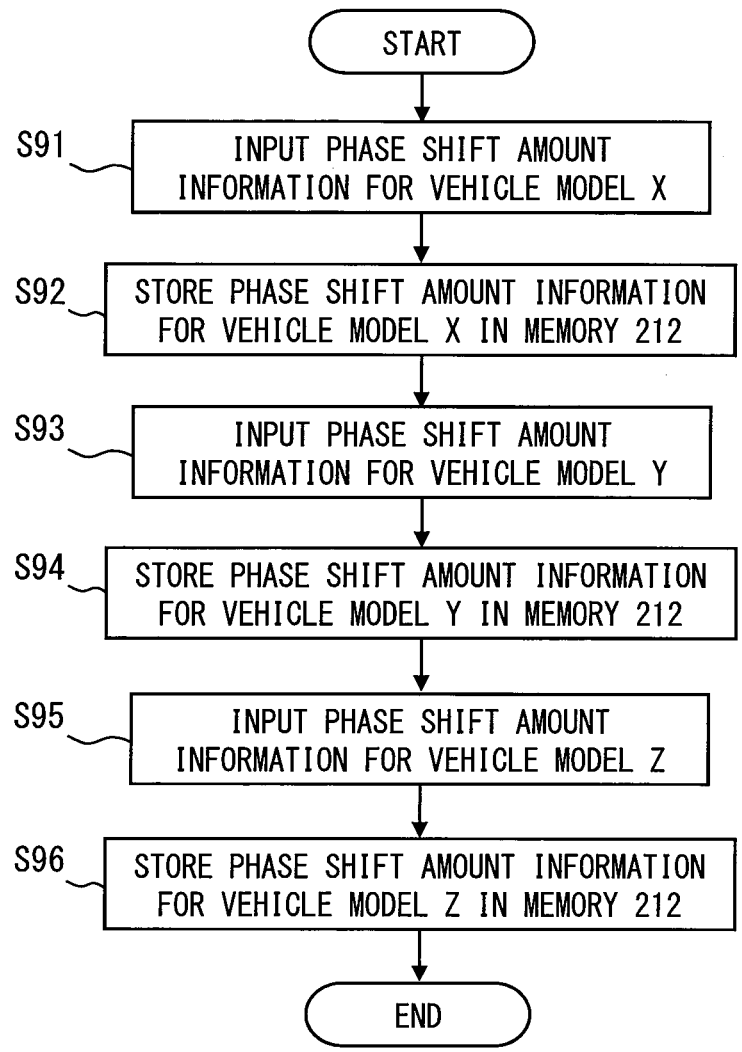
FIG. 19 is a flowchart of a process executed to store a phase shift amount according to an eleventh embodiment.

According to an eleventh embodiment, a process shown in FIG. 19 is performed during manufacture. In FIG. 19, at step S91, the phase shift amount information for a vehicle model X is inputted. The inputted phase shift amount information for the vehicle model X is stored in the memory 212 (step S92). At step S93, the phase shift amount information for a vehicle model Y is inputted. The phase shift amount information for the vehicle model Y is also stored in the memory 212 (step S94). Further, the phase shift amount information for a vehicle model Z is inputted (step S95). The phase shift amount information for the vehicle model Z is also stored in the memory 212 (step S96). In FIG. 19, the phase shift amount information for three vehicle models X, Y, and Z are inputted and stored. Alternatively, the phase shift amount information for two or more than three vehicle models can be stored.

Figure 20:
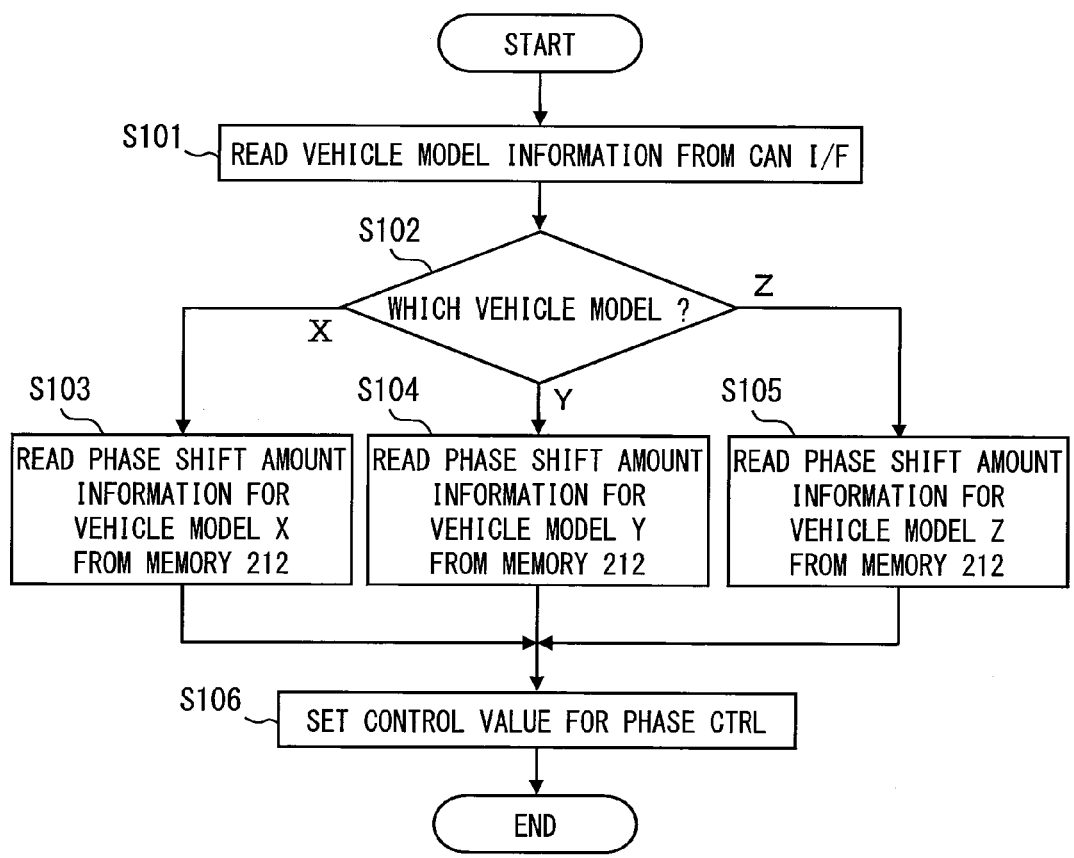
FIG. 20 is a flowchart of a process executed to set the phase shift amount according to the eleventh embodiment.

According to the present embodiment, a process shown in FIG. 20 is performed during actual communication. In FIG. 20, at step S101, vehicle model information is read through the CAN 300 and the I/F 213.

Then, it is determined which vehicle model is read. If the vehicle model X is read, the process proceeds to step S103 where the phase shift amount information for the vehicle model X is read from the memory 212. If the vehicle model Y is read, the process proceeds to step S104 where the phase shift amount information for the vehicle model Y is read from the memory 212. If the vehicle model Z is read, the process proceeds to step S105 where the phase shift amount information for the vehicle model Z is read from the memory 212.

At step S106, a control value used to control the phase shift amount is set based on the phase shift amount information read at step S103, S104, or S105.

In such an approach, appropriate directivity for roof inclinations which vary depending on the vehicle models can be set.

(Modifications)

While the present disclosure has been described with reference to the embodiments, it is to be understood that the disclosure is not limited to the embodiments. The present disclosure is intended to cover various modifications and equivalent arrangements inside the spirit and scope of the present disclosure.

For example, in the preceding embodiments, two antennas 110A and 110B are located at different positions in a front-rear direction of the vehicle and also located at different positions in a top-bottom direction of the vehicle. Alternatively, two antennas can be located at the same position in the top-bottom direction while being located at different positions in the front-rear direction (first modification). In addition, the relative positional relationship between two antennas can be changed in various ways. Further, the number of antennas can be three or more (second modification). Furthermore, although the preceding embodiments are for vehicles, application of the preset disclosure is not limited to vehicles.

What is claimed is:

1. A wireless communication apparatus comprising:
a plurality of antennas;
a receiver that performs diversity reception using the plurality of antennas;
a transmitter that outputs a signal;
a selector circuit that is connected to the plurality of antennas;
a divider located in a transmission line which connects the selector circuit to the transmitter, wherein the divider distributes the signal outputted from the transmitter to the plurality of antennas during transmission of the signal;
a phase shifter that is located in at least one of a plurality of transmission lines, each of which connects the divider to a corresponding one of the plurality of antennas, wherein the phase shifter generates a phase difference between the signal distributed to one of the plurality of antennas and the signal distributed to another one of the plurality of antennas through shifting of at least one of a phase of the signal distributed to the one of the plurality of antennas and a phase of the signal distributed to the another one of the plurality of antennas by a corresponding phase shift amount;
a controller that is mounted on a vehicle and controls the corresponding phase shift amount, which is shifted by the phase shifter;
a communication-type determination device that determines which one of vehicle-to-vehicle communication and vehicle-to-road-side communication is performed through the plurality of antennas; and
a memory that stores a preset phase shift amount for the vehicle-to-vehicle communication, and a preset phase shift amount for the vehicle-to-road-side communication, wherein:
when the communication-type determination device determines that the vehicle-to-vehicle communication is performed, the controller reads the preset phase shift amount for the vehicle-to-vehicle communication from the memory and sets the preset phase shift amount for the vehicle-to-vehicle communication as the corresponding phase shift amount; and
when the communication-type determination device determines that the vehicle-to-road-side communication is performed, the controller reads the preset phase shift amount for the vehicle-to-road-side communication from the memory and sets the preset phase shift amount for the vehicle-to-road-side communication as the corresponding phase shift amount.

2. The wireless communication apparatus according to claim 1 wherein
the memory stores a plurality of phase shift amounts caused by the phase shifter corresponding to a plurality of elevation angles used to transmit a radio wave;
the plurality of antennas is located at different positions in a top-bottom direction of the vehicle, and
the controller sets the phase shift amount caused by the phase shifter by selectively reading one of the plurality of phase shift amounts stored in the memory.

3. The wireless communication apparatus according to claim 1, wherein:
the memory stores a plurality of phase shift amounts capable of providing different horizontal directivities;
the plurality of antennas is located at different positions in a front-rear direction of the vehicle, and
the controller sets the phase shift amount caused by the phase shifter by selectively reading one of the plurality of phase shift amounts stored in the memory.

4. The wireless communication apparatus according to claim 3, further comprising:
a road-type determination device configured to determine whether the vehicle moves on an expressway, wherein
the plurality of phase shift amounts stored in the memory includes a phase shift amount for providing a horizontal directivity different from the front-rear direction of the vehicle and a phase shift amount for providing no horizontal directivity,
when the road-type determination device determines that the vehicle moves on the expressway, the controller sets the phase shift amount caused by the phase shifter by reading the phase shift amount for providing the horizontal directivity different from the front-rear direction of the vehicle, and
when the road-type determination device does not determine that the vehicle moves on the expressway, the controller sets the phase shift amount caused by the phase shifter by reading the phase shift amount for providing no horizontal directivity.

5. The wireless communication apparatus according to claim 1, wherein:

the memory stores a plurality of phase shift amounts capable of providing directivities with different elevation angles and stores a plurality of vehicle models corresponding to the plurality of phase shift amounts, and the wireless communication apparatus comprises an obtaining device configured to obtain a vehicle model of the vehicle, wherein the controller sets the phase shift amount caused by the phase shifter by reading from the memory the phase shift amount corresponding to the vehicle model obtained by the obtaining device.

6. The wireless communication apparatus according to claim 1, further comprising:

an amplifier located between the divider and each of the plurality of antennas.

7. A wireless communication apparatus comprising:

a plurality of antennas;

a receiver that performs diversity reception using the plurality of antennas;

a transmitter that outputs a signal;

a selector circuit that is connected to the plurality of antennas;

a divider located in a transmission line which connects the selector circuit to the transmitter, wherein the divider distributes the signal outputted from the transmitter to the plurality of antennas during transmission of the signal;

a phase shifter that is located in at least one of a plurality of transmission lines, each of which connects the divider to a corresponding one of the plurality of antennas, wherein the phase shifter generates a phase difference between the signal distributed to one of the plurality of antennas and the signal distributed to another one of the plurality of antennas through shifting of at least one of a phase of the signal distributed to the one of the plurality of antennas and a phase of the signal distributed to the another one of the plurality of antennas by a corresponding phase shift amount;

a controller that is mounted on a vehicle and controls the corresponding phase shift amount, which is shifted by the phase shifter;

a memory that stores:

a plurality of phase shift amounts, which respectively provide directivities for different elevation angles; and a plurality of vehicle models, which respectively correspond to the plurality of phase shift amounts, and an obtaining device that obtains a vehicle model of the vehicle, wherein:

the plurality of antennas is located at different positions, respectively, in a top-bottom direction of the vehicle; and the controller sets the corresponding phase shift amount by reading from the memory a corresponding one of the plurality of phase shift amounts, which corresponds to the vehicle model obtained by the obtaining device.

* * * * *